United States Patent
Balakrishnan et al.

(10) Patent No.: US 9,577,192 B2
(45) Date of Patent: Feb. 21, 2017

(54) METHOD FOR FORMING A METAL CAP IN A SEMICONDUCTOR MEMORY DEVICE

(71) Applicant: Sony Corporation, Tokyo (JP)

(72) Inventors: Muralikrishnan Balakrishnan, Boise, ID (US); Zailong Bian, Boise, ID (US); Gowrisankar Damarla, Boise, ID (US); Hongqi Li, Boise, ID (US); Jin Lu, Boise, ID (US); Shyam Ramalingam, Boise, ID (US); Xiaoyun Zhu, Boise, ID (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/283,539

(22) Filed: May 21, 2014

(65) Prior Publication Data

US 2015/0340247 A1  Nov. 26, 2015

(51) Int. Cl.
*H01L 45/00* (2006.01)
*H01L 21/48* (2006.01)
*H01L 21/321* (2006.01)

(52) U.S. Cl.
CPC ....... *H01L 45/1683* (2013.01); *H01L 21/3212* (2013.01); *H01L 21/4817* (2013.01); *H01L 45/04* (2013.01); *H01L 45/06* (2013.01); *H01L 45/085* (2013.01); *H01L 45/12* (2013.01); *H01L 45/122* (2013.01); *H01L 45/1233* (2013.01); *H01L 45/16* (2013.01)

(58) Field of Classification Search
CPC .................................................. H01L 45/1683
See application file for complete search history.

(56) References Cited

U.S. PATENT DOCUMENTS

| | | | |
|---|---|---|---|
| 7,943,420 B1 * | 5/2011 | Breitwisch | H01L 27/2436 257/E21.067 |
| 9,006,022 B2 * | 4/2015 | Li | H01L 45/1253 257/4 |
| 2004/0224497 A1 | 11/2004 | Barth | |
| 2004/0232552 A1 | 11/2004 | Wang et al. | |
| 2006/0094236 A1 | 5/2006 | Elkins et al. | |
| 2007/0108430 A1 | 5/2007 | Lung | |
| 2014/0124726 A1 | 5/2014 | Oh | |
| 2015/0115346 A1 * | 4/2015 | Hsu | H01L 27/11521 257/317 |

OTHER PUBLICATIONS

Kim et al., "Applications of atomic layer deposition to nanofabrication and emerging nanodevices," Thin Solid Films, 2009, vol. 517, Iss. 8, pp. 2563-2580.
International Search Report for International (PCT) Patent Application No. PCT/JP2015/002281 dated Aug. 5, 2015, 5 pages.

* cited by examiner

*Primary Examiner* — Yu-Hsi D Sun
(74) *Attorney, Agent, or Firm* — Sheridan Ross P.C.

(57) ABSTRACT

Exemplary embodiments of the present invention are directed towards a method for fabricating a semiconductor memory device comprising selectively depositing a material to form a cap above a recessed cell structure in order to prevent degradation of components inside the cell structure in oxidative or corrosive environments.

20 Claims, 2 Drawing Sheets

US 9,577,192 B2

METHOD FOR FORMING A METAL CAP IN A SEMICONDUCTOR MEMORY DEVICE

FIELD

Certain embodiments of the disclosure relate to forming a semiconductor device. More specifically, embodiments of the disclosure relate to a method for forming a metal cap in a semiconductor memory device.

BACKGROUND

Recently, the requirements on nonvolatile memory chips' storage capacity and power consumption have been advancing rapidly. Development of miniaturized and high-speed semiconductor elements is progressing at a similar pace. Resistance varying memory device are being used more often to replace flash memory devices. A resistance varying memory device employs a variable resistance element as a storage element. The resistance varying memory device includes, but is not limited to, ReRAM (Resistive RAM), CBRAM (Conductive Bridging Random Access Memory), phase change RAM (PCRAM), and the like. In a typical resistive memory device, cell material is deposited on a substrate using a conventional method, such as CVD, PVD, or plating. The cell material can be homogenous or non-homogeneous, e.g., consisting of multiple layers. The substrate, including bottom electrodes, can be homogenous or nonhomogeneous, e.g., a combination of metal contacts and a dielectric. A conductive metal layer is deposited on the cell material, acting as the top electrode. Generally, the cell material resistance is changed, for example, from a high-resistance state to a low-resistance state, when a certain voltage is applied to the top electrode.

However, it is difficult to make such a memory cell structure using photoresist masking and plasma etching, because the cell material tends to be complex and may, for example, consist of multiple transitional metal elements. Thus, these advanced cell materials cannot be patterned easily by commercially available dry etching methods. Accordingly, a damascene process is generally used to fabricate the cell structures, where a thick layer (acting as a template layer) is deposited on a substrate and patterned with open trenches where cell material will be deposited. A thick coating of the cell material is then deposited that significantly overfills the trenches in the template layer. The excess cell material above the template layer (referred to as overburden) is removed through chemical-mechanical planarization (CMP), and the template layer is exposed. The template layer is selectively removed or exhumed via a chemical method, a wet strip or a dry strip, and isolated cell structures are fabricated.

However, during the exhumation, the top of the cell materials is impacted or damaged through oxidization or corrosion because of the dry/wet chemical reactions. This degrades the top electrode conductivity and the cell material performance.

Therefore there is a need in the art for a method for forming a semiconductor memory device without degradation of the cell material in accordance with exemplary embodiments of the present invention.

SUMMARY

A method for forming a metal cap in a semiconductor memory device is provided substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

FIG. 1 depicts a first step in a fabrication process in accordance with exemplary embodiments of the present invention;

FIG. 2 depicts a second step in the fabrication process in accordance with exemplary embodiments of the present invention;

FIG. 3 depicts a third step in the fabrication process in accordance with exemplary embodiments of the present invention;

FIG. 4 depicts a fourth step in the fabrication process in accordance with exemplary embodiments of the present invention;

DETAILED DESCRIPTION

Certain implementations may be found in a selectively formed metal cap in a memory cell structure. According to one embodiment, a memory cell can be formed with a damascene process. Namely, a template layer is patterned and etched to form trenches, active cell material and a first metal layer are deposited forming structures in the trenches, and then the structures in the trenches are isolated by a chemical-mechanical planarization (CMP). The exposed first metal surface is cleaned and selectively covered with a cap which comprises a second metal. The second metal has some resistance to oxidation and/or corrosion. The template layer is selectively removed by plasma enhanced oxidation, known as exhumation, or by chemical dissolving. The top surface of the active cell material and the top electrode are protected by the cap layer during template layer removal. The memory cell may be resistive RAM (ReRAM), conductive-bridge RAM (CB-RAM) cell, phase change memory (PCRAM), or the like.

FIGS. 1-4 depict a method for forming a metal cap in a semiconductor memory device 100 in accordance with exemplary embodiments of the present invention.

Figure 1:
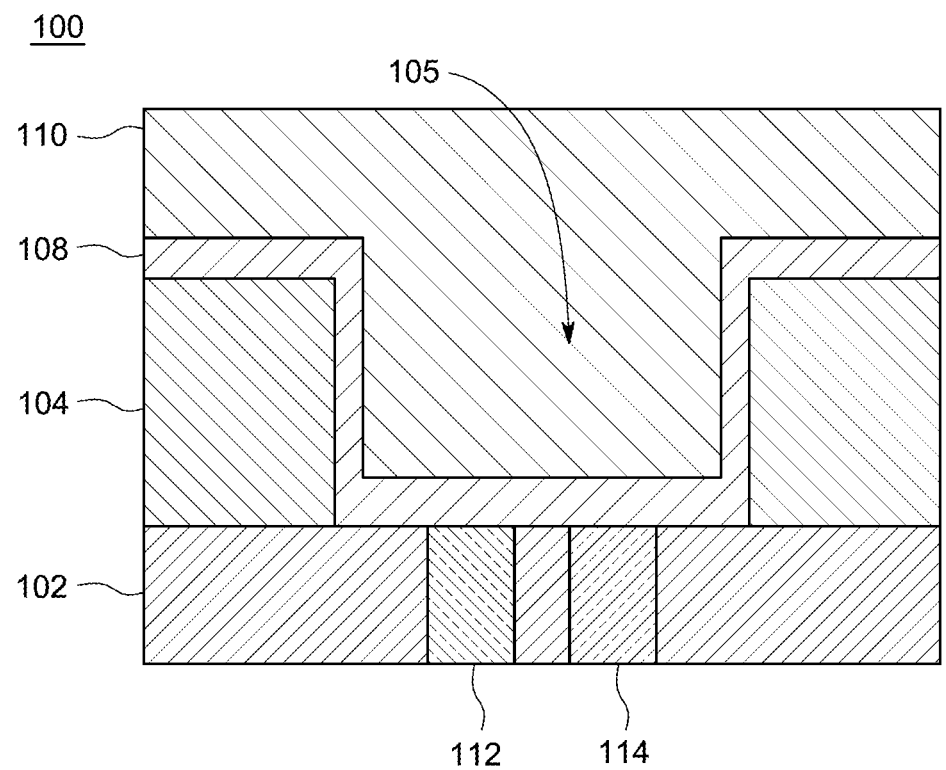
FIGS. 1-4 depict a method for forming a metal cap in a semiconductor memory device in accordance with exemplary embodiments of the present invention.

FIG. 1 depicts a first step in a fabrication process of the device 100. The result of a damascene process is the structure shown in FIG. 1, where a substrate 102 has a first contact 112 and a second contact 114 (bottom electrode contacts—BEC). Those of ordinary skill in the art will recognize that the substrate 102 may contain a single contact, or a plurality of contacts, depending on the usage of the resulting device 100 and the present invention does not limit the device 100 to having merely two contacts. The metal contacts 112 and 114 are electrically conductive, acting as bottom electrodes, and are fabricated through a substrate layer 102 which contains dielectric material such as silicon oxide, silicon nitride, or the like. This dielectric layer 102 separates the active cell material 108 from an active semiconductor base material (not shown in FIG. 1, but well known to those of ordinary skill in the art). The active semiconductor base material can be a terminal, for example, a gate terminal, of a transistor. In some embodiments such a transistor is a metal-oxide-semiconductor field-effect transistor (MOSFET) for amplifying or switching electronic signals. A template layer 104 sits atop the substrate 102. A trench 105 is formed in the template layer 104 during the damascene process. Cell material 108 is deposited on and lines the trench 105. A first metal layer 110 is formed above the cell material 108 to fill the trench 105. The first metal layer 110 will form the top electrode. In some embodiments, copper is chosen as the first metal layer 110 to achieve a low resistance cell metal line. In other embodiments, the metal layer 110 may be Cu, Au, Ta, Ru, Pt, W, Ti, Poly, or the like. The template layer 104 may be comprised of Carbon, PolySilicon, Silicon oxide, or the like.

Figure 2:
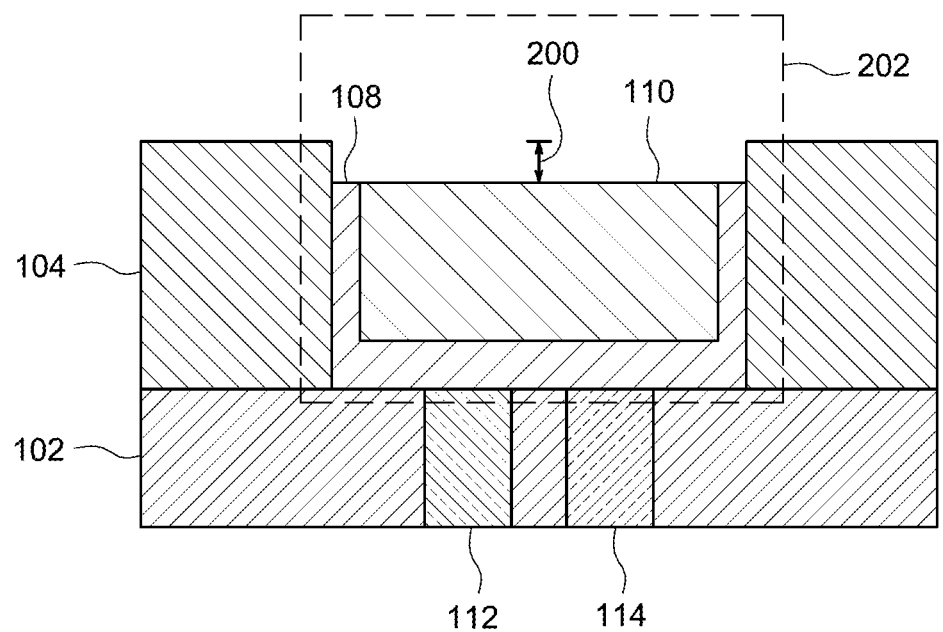

FIG. 2 depicts a second step in the fabrication process in accordance with exemplary embodiments of the present invention. Chemical-mechanical planarization (CMP) is performed to remove the bulk of the first metal layer 110 and a portion of the cell material 108. The planarized first metal layer 110 and the cell material 108 form the cell structure 202, which is recessed from the plane of the template layer 104. According to one embodiment, the CMP process uses traditional CMP abrasives such as colloidal silica, fumed silica, or colloidal alumina. The first metal layer 110 and the cell material 108 are removed by mechanical actions and/or chemical modification during the CMP. When the template layer 104 is exposed by CMP, the friction between the wafer surface and the polishing pad might change significantly, and a friction-based endpointed process control method becomes feasible. Similarly, wafer surface optical reflection strength might change significantly when the template layer 104 is exposed by CMP and this makes an optical friction-based end-pointed process control method feasible. After the change in process traces (such as friction trace or optical reflection trace) is captured, over-polishing begins. Over-polishing results in the cell material 108 receding beneath the plane of the template layer 104, leaving a recess 200. The depth of the recess 200 is mostly determined by the over-polish time. Over polishing also fully exposes the surface of the template layer 104 so that it will be consumed later with an exhumation method. After the CMP, a wet clean process is performed to remove any oxidized surface metal and to expose a fresh surface of the first metal layer 110 in the trench 105. The fresh surface aids in the selective deposition the cap material in recess 200 at a later stage described in FIG. 3. In some embodiments, the cap material to be deposited in recess 200 is W or Ti, both of which have stronger resistance to corrosion than copper (namely, the first metal layer 110) or the active cell material 108. The cell structure 202 is more stable when a wet clean process is applied onto the wafer after the template layer 104 is exhumed, in order to remove various polymer residuals generated during plasma enhanced exhumation. According to some embodiments, a plasma-based dry etch method selectively removes the template layer 104 while the cell material 108 remains. In some cases, highly active chemical species may be generated when the template layer 104 is exhumed, producing solid byproducts over the surface of the cell structure 202. According to one embodiment, these byproducts are selectively removed by a wet clean method using some acidic or basic aqueous solution. This process is generally referred to as the post-etch clean, well known to those of ordinary skill in the art. Copper is sensitive to this clean. W and Ti are immune to such wet clean.

Figure 3:
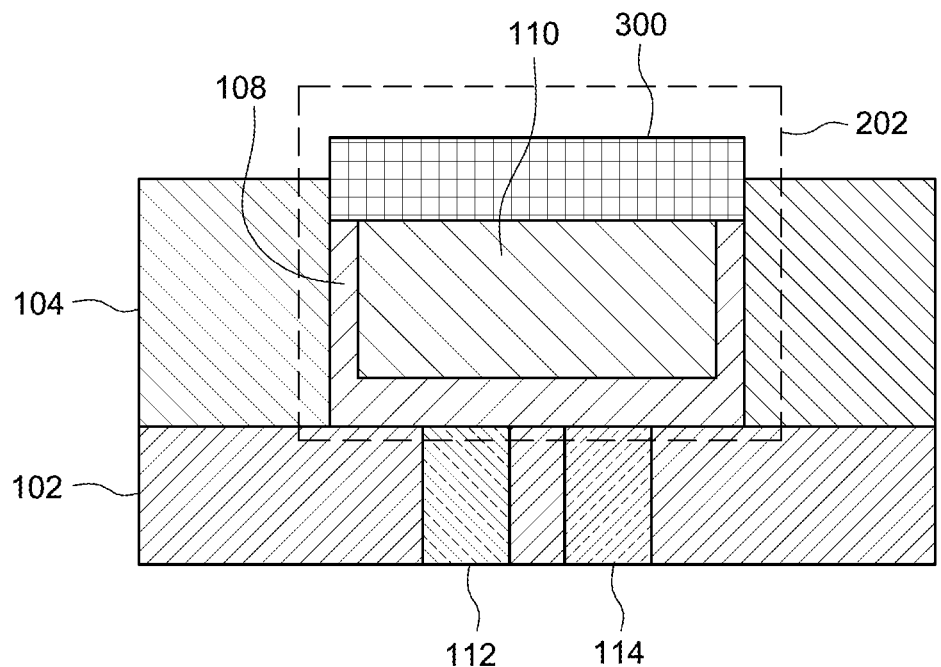

FIG. 3 depicts a third step in the fabrication process in accordance with exemplary embodiments of the present invention. A material is selectively deposited as a cap 300 in the recess 200 on the fresh surface of the first metal layer 110, to protect the cell structure 202, and specifically to protect the first metal layer 110 from any chemical reaction that may be caused when the template layer 104 is selectively removed. The cap 300 is only deposited in the recess 200 and is not deposited on the template layer 104. The template layer 104 is still exposed after cap 300 formation. In some embodiments, the cap 300 may be formed using W, Ti, Co, or the like, able to be selectively deposited over the first metal layer 110. As an example, according to one embodiment, the selective depositing of the elemental tungsten is by chemical vapor deposition within a deposition chamber using gaseous $WF_6$ and $SiH_4$ as deposition precursors which are fed to the chamber during the deposition. Inert and/or other gases may be fed to the chamber during the deposition. In this embodiment during the deposition, substrate temperature is from approximately 250° C. to 350° C., chamber pressure is from approximately 1 mTorr to 100 mTorr, $WF_6$ flow rate to the chamber is from approximately 10 sccm to 1,000 sccm, and $SiH_4$ flow rate to the chamber is from approximately 5 sccm to 50 sccm. An example inert gas flow rate (e.g., Ar) is approximately 0 sccm to 1,000 sccm. Those of ordinary skill in the art will recognize that these ranges are not specifically required and other ranges may be used in the implementation of the present invention.

A W Cap or Ti Cap has resistance to corrosion during a wet clean, which further prevents corrosion of the first metal layer 110 (e.g., a Cu layer). In some embodiments, the cap 300 is a selective dielectric cap using materials such as SiN, SiOx, and high-k dielectrics such as HfOx, AlOx, ZrOx, and the like. According to exemplary embodiments, the selective metal or selective dielectric is deposited by one of chemical vapor deposition (CVD), atomic layer deposition (ALD), selective electroless plating or the like. In some embodiments, the cap 300 can be sacrificial, i.e., the cap 300 can be selectively removed by dry etch technology after template layer 104 exhumation.

Figure 4:
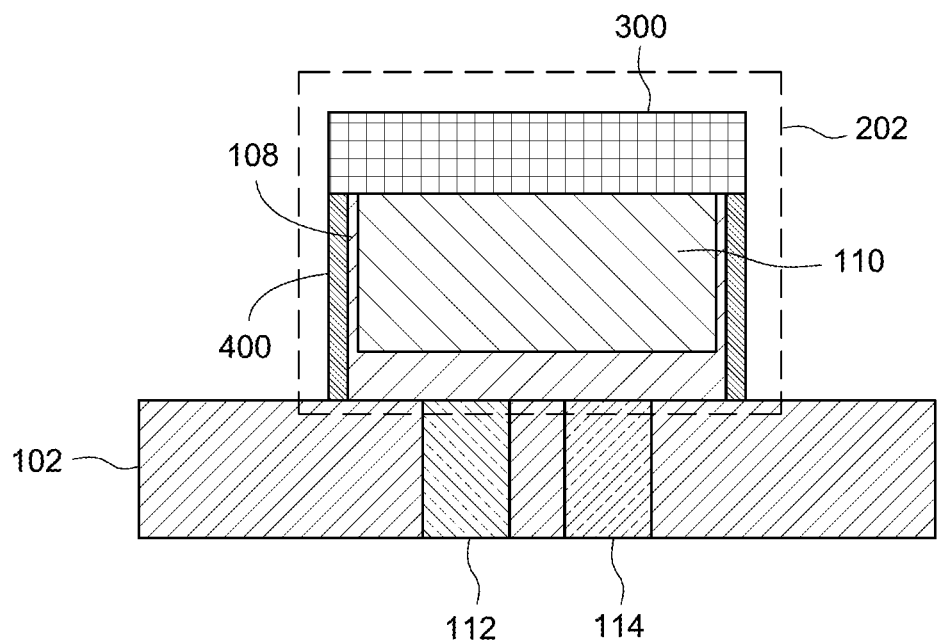

FIG. 4 depicts a fourth step in the fabrication process in accordance with exemplary embodiments of the present invention. The template layer 104 is selectively removed via a dry process or a wet process. According to exemplary embodiments, if the template layer 104 is carbon, oxygen-containing plasma is used for the exhume process. If the template layer is polysilicon, exhumation can be performed using F-containing plasma dry etch. In another embodiment where the template layer 104 is comprised of silicon oxide, an HF containing aqueous solution is used for the exhumation process. Those of ordinary skill in the art will recognize that the exhumation process will conform to the material used to form the template layer 104. Due to the formation of the cap 300 above the first metal layer 110, the top surface of the metal layer 110 in the cell structure 202 is prevented from oxidation or corrosion during exhumation and is well preserved as compared to exhume processes where the copper layer is not protected. However, part of the side wall of the active cell material 108 might be oxidized or chemically modified, shown as the sidewall film 400 in FIG. 4. The sidewall film 400 becomes a barrier to isolate the inner cell structures 108 and 110 from various chemical reactions outside. While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for fabricating a semiconductor memory device comprising:
    performing a chemical-mechanical planarization to form a cell structure entirely recessed in a template layer, wherein a top surface of the cell structure is below a top surface of the template layer, forming a recess; and
    selectively depositing a material in the recess to form a cap above the cell structure in order to prevent degradation of components inside the cell structure in oxidative or corrosive environments,
    wherein the cap is a metal cap, and
    wherein the cell structure includes a top electrode and an active cell material.

2. The method of claim 1, wherein selectively depositing the material to form a cap further comprises:
    using one of chemical vapor deposition, atomic layer deposition or selective electroless plating for deposition.

3. The method of claim 1, further comprising removing the cap using a dry etch method.

4. The method of claim 1, wherein the cell structure is formed in a trench in the template layer.

5. The method of claim 4, wherein the cap is formed using one of W, Ti, or Co.

6. The method of claim 1, further comprising a bottom electrode formed below the cell structure.

7. The method of claim 6, further comprising a transistor connected to the bottom electrode.

8. The method of claim 6, wherein the cap covers an entire surface of the top electrode.

9. The method of claim 1, wherein the top electrode is formed over the active cell material.

10. The method of claim 1, wherein the cap is deposited in the recess such that it covers an entire surface of the top electrode.

11. A method for fabricating a semiconductor memory device comprising:
    performing a chemical-mechanical planarization to form a cell structure entirely recessed in a template layer, wherein a top surface of the cell structure is below a top surface of the template layer, forming a recess; and
    selectively depositing a material in the recess to form a cap above the cell structure in order to prevent degradation of components inside the cell structure in oxidative or corrosive environments,
    wherein the cell structure includes a top electrode and an active cell material, and
    wherein the cap covers an entirety of a surface that includes a portion of the top electrode and a portion of the active cell material.

12. The method of claim 11, further comprising a bottom electrode formed below the cell structure.

13. The method of claim 12, further comprising a transistor connected to the bottom electrode.

14. The method of claim 11, wherein selectively depositing the material to form a cap further comprises:
    using one of chemical vapor deposition, atomic layer deposition or selective electroless plating for deposition.

15. The method of claim 11, further comprising removing the cap using a dry etch method.

16. The method of claim 11, wherein the cell structure is formed in a trench in a template layer.

17. The method of claim 11, wherein the cap is a metal cap.

18. The method of claim 17, wherein the cap is formed using one of W, Ti, or Co.

19. The method of claim 1, wherein the cap is formed using one of W, Ti, or Co.

20. The method of claim 1, wherein the cap covers an entirety of a surface that includes a portion of the top electrode and a portion of the active cell material.

* * * * *